US009621134B2

(12) United States Patent
Tian et al.

(10) Patent No.: US 9,621,134 B2
(45) Date of Patent: Apr. 11, 2017

(54) VOLTAGE LEVEL SHIFTER

(71) Applicant: FREESCALE SEMICONDUCTOR, INC., Austin, TX (US)

(72) Inventors: Lei Tian, Shanghai (CN); Yongqin Liang, Shanghai (CN); Xiaowen Wu, Shanghai (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 37 days.

(21) Appl. No.: 14/887,333

(22) Filed: Oct. 20, 2015

(65) Prior Publication Data

US 2016/0308442 A1    Oct. 20, 2016

(30) Foreign Application Priority Data

Apr. 17, 2015    (CN) .......................... 2015 1 0297162

(51) Int. Cl.
    *H03L 5/00*        (2006.01)
    *H03K 3/356*       (2006.01)
(52) U.S. Cl.
    CPC .............................. *H03K 3/356113* (2013.01)
(58) Field of Classification Search
    USPC ........................................................ 327/333
    See application file for complete search history.

(56) References Cited

U.S. PATENT DOCUMENTS

| | | | |
|---|---|---|---|
| 6,954,100 B2 | 10/2005 | Dharne et al. | |
| 7,002,371 B2 | 2/2006 | Kase et al. | |
| 7,009,424 B2 | 3/2006 | Khan et al. | |
| 7,061,299 B2 | 6/2006 | Khan et al. | |
| 7,180,329 B1 | 2/2007 | Sia | |
| 7,397,297 B2 | 7/2008 | Kimura | |
| 7,501,876 B2 | 3/2009 | Kimura | |
| 7,560,971 B2 | 7/2009 | Heikkila | |
| 7,683,668 B1 | 3/2010 | Thakur et al. | |
| 7,782,113 B2 | 8/2010 | Lin | |
| 7,855,575 B1 | 12/2010 | Hsu et al. | |
| 8,350,592 B1 | 1/2013 | Malhan et al. | |
| 8,432,189 B1 | 4/2013 | Malhan et al. | |
| 8,643,425 B2 | 2/2014 | Chaudhry et al. | |
| 8,723,582 B1 | 5/2014 | Goyal et al. | |
| 8,836,406 B2 | 9/2014 | Wang | |
| 2010/0289566 A1* | 11/2010 | Ko ....................... | H04B 1/1018 327/552 |
| 2015/0042396 A1* | 2/2015 | Koudate ........ | H03K 19/018521 327/333 |

\* cited by examiner

*Primary Examiner* — Lincoln Donovan
*Assistant Examiner* — Patrick Chen
(74) *Attorney, Agent, or Firm* — Charles E. Bergere

(57) ABSTRACT

A level shifter in a primary voltage domain has a control module receiving an input signal from a secondary voltage domain for controlling operation of the level shifter. The control module includes a complementary pair of transistors and a first native transistor connected in a series current conduction path in the primary voltage domain. The complementary pair of transistors have gates connected to receive the input signal and the first native transistor has a gate connected to limit to a leakage current the current in the series current conduction path.

16 Claims, 3 Drawing Sheets

VOLTAGE LEVEL SHIFTER

BACKGROUND

The present invention is directed to integrated circuits and, more particularly, to a voltage level shifter.

Semiconductor devices often have more than one direct current (DC) power supply voltage domain. Such devices include a primary source of DC power, which may be a battery, a DC-DC converter for providing a secondary power supply at a different voltage, a DC-DC control module for controlling the DC-DC converter, and a power management controller for managing powering-up, powering-down, standby and sleep of the device, for example.

Voltage level shifters are used as interfaces between the different voltage domains. A level shifter converts the voltage level of an asserted signal from an originating voltage domain to a voltage suitable for the destination voltage domain. The voltage level of de-asserted signals is typically the same (e.g., ground). A complex semiconductor device such as a system on a chip (SoC) may have many level shifters. It is important that the power consumption and leakage current of the level shifters be reduced.

Level shifters are often used in applications, such as battery powered devices, where the steady voltage of the primary power supply varies. The reliability and predictability of powering-up of the power supply for each domain are also concerns. In a conventional level shifter, a detector may be added in the domain of the primary power supply to detect if a secondary power supply of another domain has attained the start-up target voltage. However, including such a detector increases circuit area, consumes more power, and degrades the efficiency of DC-DC conversion, especially in low power mode.

It would be advantageous to have a voltage level shifter having low leakage current without needing an isolation signal, and having reliable powering-up of the power supply and a well-controlled output voltage even with a big range of primary power supply voltage.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION

Figure 1:
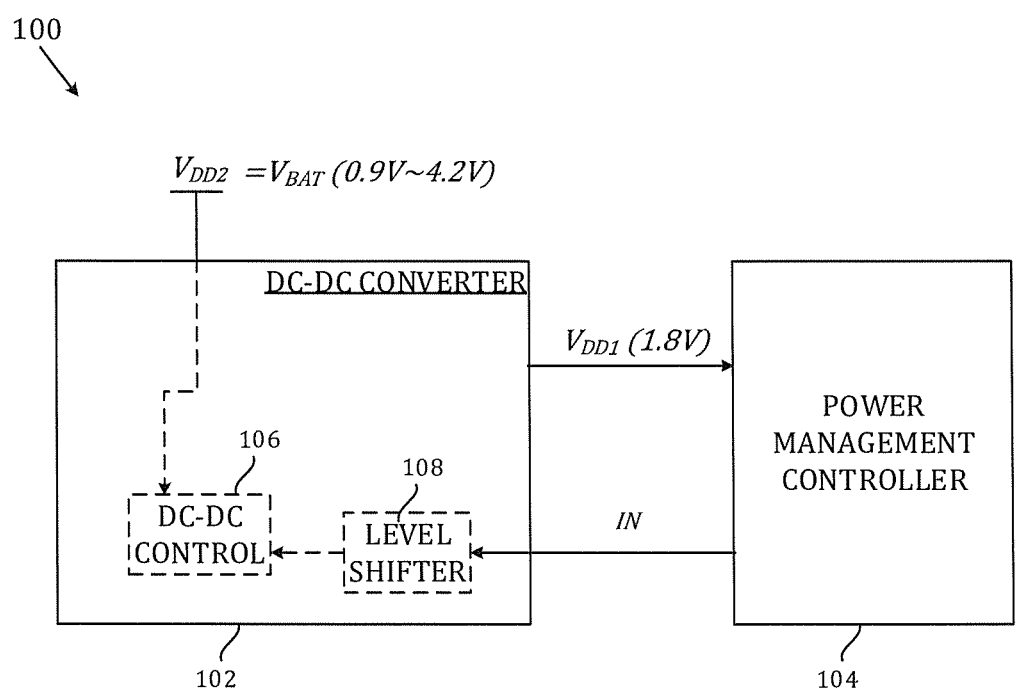
FIG. 1 is a schematic block diagram of power supply apparatus in which the present invention can be implemented.

FIG. 1 illustrates a power supply apparatus 100 in which the present invention can be implemented. The power supply apparatus 100 has a DC-DC converter 102 that provides a secondary regulated voltage $V_{DD1}$. The secondary voltage $V_{DD1}$ is derived from an unregulated primary voltage $V_{DD2}$, which may be supplied by a battery, for example, although the invention is applicable to apparatus 100 having other types of primary power supply. The DC-DC converter 102 supplies power at the regulated voltage $V_{DD1}$ to a power management controller 104 and other circuit modules in the domain of the regulated voltage $V_{DD1}$. The power management controller 104 can manage powering-up, powering-down, standby and sleep of the device that the apparatus 100 powers, for example.

The DC-DC converter 102 includes a DC-DC control module 106 that controls the converter and is supplied with power in the unregulated primary voltage domain $V_{DD2}$. The DC-DC converter 102 also includes a level shifter 108 that receives an input signal IN in the secondary regulated voltage $V_{DD1}$ domain from the power management controller 104 and provides the control signals to the DC-DC control module 106 in the primary voltage domain $V_{DD2}$.

Figure 2:
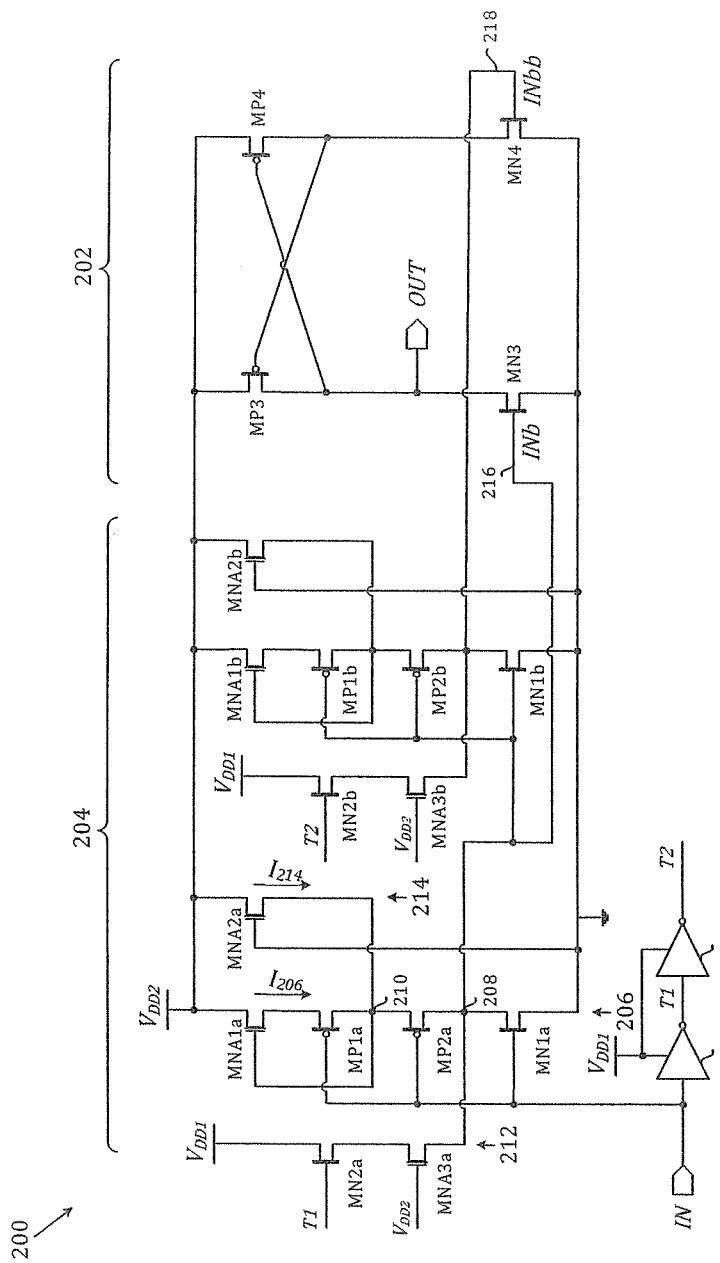
FIG. 2 is a schematic circuit diagram of a level shifter in accordance with an embodiment of the invention, given by way of example.

FIG. 2 illustrates an embodiment 200 of the level shifter 108. The level shifter 200 provides an output signal OUT in a first voltage domain $V_{DD2}$ as a function of an input signal IN in a second voltage domain $V_{DD1}$. The level shifter 200 comprises a level shifter module 202 in the first voltage domain $V_{DD2}$ for providing the output signal OUT. The level shifter 200 also comprises a control module 204 for controlling operation of the level shifter module 202. The control module 204 includes a complementary pair of transistors MN1a and MP2a and a first native transistor MNA1a connected in a series current conduction path 206 in the first voltage domain $V_{DD2}$. The complementary pair of transistors MN1a and MP2a have control nodes (gates) connected to receive the input signal IN and the first native transistor MNA1a has a control node (gate) connected to limit to a leakage current the current $I_{206}$ in the series current conduction path 206.

When the input signal IN is asserted at the level of the second voltage $V_{DD1}$, its voltage may be smaller than the first voltage $V_{DD2}$. Both the transistors MN1a and MP2a of the complementary pair conduct, which would lead to a large current $I_{206}$ in the series current conduction path 206. However, the series connection of the first native transistor MNA1a limits the current $I_{206}$ to the leakage current of MNA1a. Since the first transistor MNA1a is a native transistor, its source voltage can be different from its body voltage, which then increases its threshold voltage $V_{TH}$ and restricts its leakage current.

In this example of the level shifter 200, the complementary pair of transistors MN1a and MP2a are connected in inverter configuration to provide a control signal INb in the first voltage domain $V_{DD2}$ that is inverted relative to the input signal IN to control the level shifter module 202.

Each of the transistors MN1a and MP2a of the complementary pair may be connected in the series current conduction path 206 to a first intermediate node 208 that is connected to control the level shifter module 202. A further transistor MP1a is connected in the series current conduction path 206 to a first complementary transistor MP2a of the complementary pair at a second intermediate node 210 and to the first native transistor MNA1a. The first complementary transistor MP2a and the further transistor MP1a are of a first type (p-type) and the first native transistor MNA1a is of the opposite type (n-type) to the first type. The first native transistor MNA1a may have a control node (gate) connected to the second intermediate node 210 and be reverse biased by a voltage drop in the series current conduction path 206 across the further transistor MP1a. The first native transistor MNA1a may be more reverse biased when the further transistor MP1a is relatively non-conductive than when the further transistor MP1a is more conductive.

A further current conduction path 212 may be connected between the first intermediate node 208 and a voltage supply $V_{DD1}$ of the second voltage domain limiting leakage current between the first and second voltage domains $V_{DD2}$ and $V_{DD1}$.

A second native transistor MNA2a may have a current conduction path 214 connected to the second intermediate node 210 in parallel with the series combination of the first native transistor MNA1a and the further transistor MP1a. The second native transistor MNA2a provides leakage current $I_{214}$ to the second intermediate node 210 if the leakage current $I_{206}$ of the first native transistor MNA1a is insufficient during start-up of the second voltage domain $V_{DD1}$. That is, "insufficient" here means that the first native transistor MNA1a is insufficient to charge the second intermediate node 210 when the first native transistor MN1a is off (i.e., a dead state) so the second native transistor MNA2a helps to charge the second intermediate node 210. This can ensure that control signal INb is asserted even if the state of the series current conduction path 206 is indefinite, during start-up of the second voltage domain $V_{DD1}$, for example.

The level shifter module 202 may comprise a flip-flop in the first voltage domain $V_{DD2}$ and having a first input 216 connected to receive a first control signal INb from the control module 204. The control module may include duplicate elements MN1b, MP2b, MP1b, MNA1b and MNA2b receiving the first control signal INb for providing to a second input 218 of the flip-flop a second control signal INbb, inverted relative to the first control signal. This restricts the leakage current in the level shifter module 202 compared to a simple complementary metal-oxide semiconductor (CMOS) inverter configuration driven only by the control signal INb, for example, if the asserted voltages of the control signals INb and INbb are not quite as big as the first voltage $V_{DD2}$.

The example of level shifter 200 illustrated has positive voltage supplies $V_{DD1}$ and $V_{DD2}$ and ground, with p-type metal-oxide semiconductor field-effect transistors (MOSFETs) MP2a and MP2b of the complementary pairs connected on the side of the positive voltage rail and the n-type MOSFETs MN1a and MN1b on the side of the ground. However, it will appreciated that the conductivity types and polarities of the potentials may be reversed. The MOSFETs MNA1a, MNA2a, MNA3a, MNA1b, MNA2b and MNA3b are native MOSFETs, which have low threshold voltage $V_{TH}$ when the source voltage is equal to the substrate voltage. The other MOSFETs MN1a, MN2a, MP1a, MP2a, MN1b, MN2b, MP1b and MP2b are well MOSFETs, and have lower leakage current when reverse biased. The substrates of the n-type MOSFETs MN1a, MN2a, MN1b and MN2b are connected to ground, and the substrates of the p-type MOSFETs MP1a and MP2a are connected to the source of the MOSFET MP1a. The substrates of the p-type MOSFETs MP1b and MP2b are connected to the source of the MOSFET MP1a.

In the control module 204, the first native transistor MNA1a is an n-type MOSFET whose drain is connected to the voltage supply rail $V_{DD2}$, whose bulk is connected to ground, and whose source is connected to the source of the further transistor MP1a, which is a p-type MOSFET. The drain of the MOSFET MP1a and the gate of the MOSFET MNA1a are connected to the node 210. The complementary pair of transistors MN1a and MP2a are symmetrical n-type and p-type MOSFETs respectively. The source of the MOSFET MP2a is connected to the node 210 and its drain is connected to the node 208. The drain of the MOSFET MN1a is connected to the node 208 and its source is connected to ground. The MOSFETs MNA1a, MP1a, MP2a and MN1a are connected in series in the series current conduction path 206 in the first voltage domain $V_{DD2}$. The gates of the MOSFETs MP1a, MP2a and MN1a are connected in parallel to receive the input signal IN. The duplicate elements MNA1b, MP1b, MP2b and MN1b are identical to the MOSFETs MNA1a, MP1a, MP2a and MN1a, except that the gates of the MOSFETs MP1b, MP2b and MN1b are connected in parallel to the node 208 to receive the control signal INb and provide the inverted signal INbb.

In operation, when the supply voltage $V_{DD1}$ is OFF and the voltage of the input signal IN is 0V (ground), the MOSFETs MP1a and MP2a are ON. The current $I_{206}$ in the series current conduction path 206 pulls the sources of the p-type MOSFETs MP1a and MP2a up towards $V_{DD2}$ and their drains down through the gate-source capacitances of the MOSFETs MN1b and MN3. The current $I_{206}$ is limited to the leakage current of the native MOSFET MNA1a, but its reverse bias is small, since the p-type MOSFET MP1a is ON. The MOSFET MN1a is OFF and the voltage INb at the nodes 208 and 216 is pulled up towards $V_{DD2}$, apart from the voltage drops across the MOSFETS MNA1a, MP1a and MP2a, turning ON the n-type MOSFET MN3 and the p-type MOSFET MP4 in the flip-flop 202. The voltage of the output signal OUT of the level shifter module 202 is pulled down to ground. The asserted voltage INb at the node 208 turns the n-type MOSFET MN1b ON and increases the resistance of the p-type MOSFETS MP2b and MP1b, increasing the reverse bias of the native MOSFET MNA1b. The MOSFET MN1b pulls down to ground the voltage at the node 218, turning OFF the n-type MOSFET MN4 and the p-type MOSFET MP3 in the flip-flop 202.

During start-up of the apparatus 100, it may be that the voltage of the input signal IN is indefinite and insufficient to turn the p-type MOSFETs MP1a and MP2a fully ON and the n-type MOSFET MN1a fully OFF. The voltage drop across the p-type MOSFET MP1a increases a reverse bias of the native MOSFET MNA1a, aggravating the situation. However, the second native transistor MNA2a provides leakage current $I_{214}$ to the second intermediate node 210, pulling up the source voltage of the p-type MOSFET MP2a and hence the voltage INb at the nodes 208 and 216, ensuring a definite, reliable output voltage OUT.

The control module 204 also includes inverters 220 and 222 supplied with power in the second voltage domain $V_{DD1}$. The inverter 220 receives the input signal IN and provides an inverted signal T1. The inverter 222 receives the inverted signal T1 and provides a doubly inverted signal T2. In the further current conduction path 212, an n-type well MOSFET MN2a has its drain connected to the voltage supply rail $V_{DD1}$ and its source connected to the drain of an n-type native MOSFET MNA3a, whose source is connected to the node 208. The gate of the MOSFET MN2a receives the inverted signal T1 and the gate of the MOSFET MNA3a is connected to the voltage supply rail $V_{DD2}$. When the supply voltage $V_{DD1}$ is ON and the voltage of the input signal IN is 0V (ground), the inverted signal T1 turns the MOSFET MN2a ON pulling the node 208 up towards the lower of the voltages $V_{DD1}$ and $V_{DD2}$. The voltage $V_{DD1}$ at the gate of the MOSFET MN2a limits the voltage at the node 208 to $V_{DD1}$, even if the voltage $V_{DD2}$ is higher. On the contrary, if the voltage $V_{DD1}$ is higher than the voltage $V_{DD2}$, the native MOSFET MNA3a becomes reverse biased, limiting the voltage at the node 208 to $V_{DD2}$ and limiting leakage between the voltage rails $V_{DD2}$ and $V_{DD1}$. Duplicate elements MN2b and MNA3b are connected to the node 218, the gate of the MOSFET MN2b receiving the doubly inverted signal T2 for the equivalent function.

When the supply voltage $V_{DD1}$ is ON and the voltage of the input signal IN is $V_{DD1}$, the voltage $V_{DD1}$ at the gates turns the n-type MOSFET MN1a ON and increases the resistance of the p-type MOSFETS MP2a and MP1a, increasing the reverse bias of the native MOSFET MNA1a. The MOSFET MN1a pulls down to ground the voltage at the nodes 208 and 216, turning OFF the n-type MOSFET MN3 and the p-type MOSFET MP4 in the flip-flop 202. The signal INb at the node 208 at ground turns the n-type MOSFET MN1b OFF and the p-type MOSFETs MP2b and MP1b ON, pulling up the node 218. The n-type MOSFET MN4 and the p-type MOSFET MP3 in the flip-flop 202 are turned ON. The voltage of the output signal OUT of the level shifter module 202 is pulled up close to the voltage $V_{DD2}$.

Figure 3:
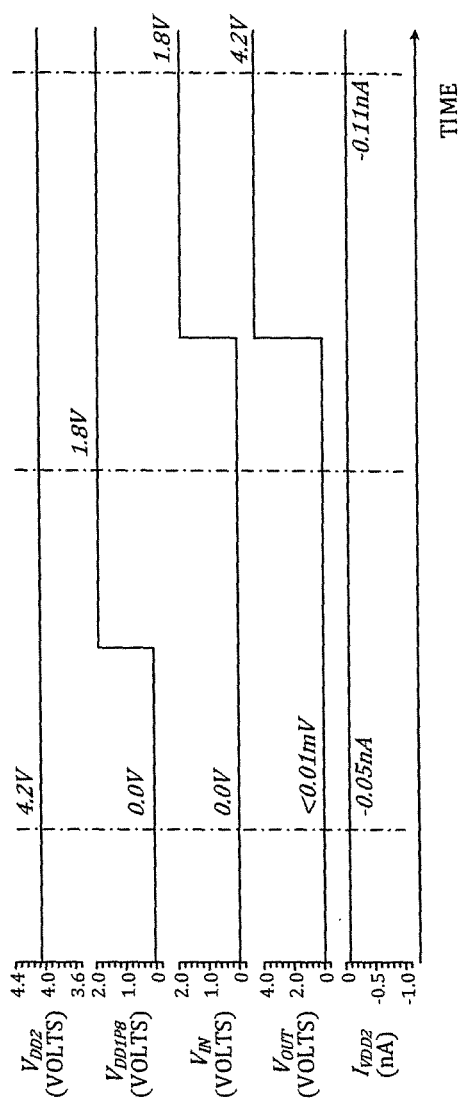
FIG. 3 is a graph against time of signals appearing in operation of the level shifter of FIG. 2.

FIG. 3 illustrates voltages and currents obtained in operation of the level shifter 200 for a case where the primary supply voltage $V_{DD2}$ is 4.2V, the secondary voltage $V_{DD1}$ is successively 0V and 1.8V and the voltage of the input signal IN is successively 0V and 1.8V. While the input signal IN is 0V, the output voltage OUT is less than 0.01 mV and the leakage current $I_{VDD2}$ drawn from the primary power supply is −0.05 nA, whether the secondary voltage $V_{DD1}$ is 0V or 1.8V. While the input signal IN is 1.8V and the secondary voltage $V_{DD1}$ is 1.8V, the output voltage OUT is 4.2V and the leakage current $I_{VDD2}$ drawn from the primary power supply is −0.11 nA. The level shifter 200 limits the current drawn from the power supply to very low levels, while providing definite and reliable output voltage levels over a wide range of variation of the primary and secondary power supply voltages.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A level shifter for providing an output signal in a first voltage domain as a function of an input signal in a second voltage domain, the level shifter comprising:
a level shifter module in the first voltage domain for providing the output signal;
a control module for controlling operation of the level shifter module, the control module including a complementary pair of transistors and a first native transistor connected in a series current conduction path in the first voltage domain, wherein each of the transistors of the complementary pair are connected in the series current conduction path to a first intermediate node that is connected to control the level shifter module; and
a further transistor connected in the series current conduction path to a first complementary transistor of the complementary pair at a second intermediate node and to the first native transistor, wherein the transistors of the complementary pair have control nodes connected to receive the input signal, and the first native transistor has a control node connected to limit to a leakage current of the current in the series current conduction path, wherein the first complementary transistor and the further transistor are of a first type and the first native transistor is of an opposite type to the first type, and wherein the control node of the first native transistor is connected to the second intermediate node and is reverse biased by a voltage drop in the series current conduction path across the further transistor.

2. The level shifter of claim 1, wherein the transistors of the complementary pair are connected in an inverter configuration to provide a control signal in the first voltage domain that is inverted relative to the input signal to control the level shifter module.

3. The level shifter of claim 1, wherein the first native transistor is more reverse biased when the further transistor is relatively non-conductive than when the further transistor is more conductive.

4. The level shifter of claim 1, wherein a further current conduction path is connected between the first intermediate node and a voltage supply of the second voltage domain for limiting leakage current between the first and second voltage domains.

5. The level shifter of claim 1, further comprising:
a second native transistor that has a current conduction path connected to the second intermediate node in parallel with a series combination of the first native transistor and the further transistor,
wherein the second native transistor provides leakage current to the second intermediate node if the leakage current of the first native transistor is insufficient during start-up of the second voltage domain.

6. The level shifter of claim 1, wherein the first voltage domain is supplied from a primary power supply and the second voltage domain is supplied from a secondary power supply.

7. The level shifter of claim 6, wherein the primary power supply is a battery.

8. The level shifter of claim 1, wherein:
the level shifter module comprises a flip-flop in the first voltage domain, the flip-flop having a first input connected to receive a first control signal from the control module, and
the control module includes duplicate elements receiving the first control signal for providing to a second input of the flip-flop a second control signal that is inverted relative to the first control signal.

9. A power supply apparatus, comprising:
first and second voltage domains; and
a level shifter for providing an output signal in the first voltage domain as a function of an input signal in the second voltage domain,
wherein the level shifter comprises:
a level shifter module in the first voltage domain for providing the output signal; and
a control module for controlling operation of the level shifter module;

wherein the control module includes a complementary pair of transistors and a first native transistor connected in a series current conduction path in the first voltage domain, wherein each of the transistors of the complementary pair are connected in the series current conduction path to a first intermediate node that is connected to control the level shifter module, wherein the transistors of the complementary pair have control nodes connected to receive the input signal and the first native transistor has a control node connected to limit to a leakage current in the series current conduction path; and a further transistor is connected in the series current conduction path to a first complementary transistor of the complementary pair at a second intermediate node and to the first native transistor, wherein the first complementary transistor and the further transistor are of a first type and the first native transistor is of the opposite type to the first type, and wherein the control node of the first native transistor is connected to the second intermediate node and is reverse biased by a voltage drop in the series current conduction path across the further transistor.

10. The power supply apparatus of claim 9, wherein the transistors of the complementary pair are connected in an inverter configuration to provide a control signal in the first voltage domain that is inverted relative to the input signal to control the level shifter module.

11. The power supply apparatus of claim 9, wherein the first native transistor is more reverse biased when the further transistor is relatively non-conductive than when the further transistor is more conductive.

12. The power supply apparatus of claim 9, wherein a further current conduction path is connected between the first intermediate node and a voltage supply of the second voltage domain limiting leakage current between the first and second voltage domains.

13. The power supply apparatus of claim 9, further comprising:
a second native transistor having a current conduction path connected to the second intermediate node in parallel with the series combination of the first native transistor and the further transistor,
wherein the second native transistor provides leakage current to the second intermediate node if the leakage current of the first native transistor is insufficient during start-up of the second voltage domain.

14. The power supply apparatus of claim 9, wherein the first voltage domain is supplied from a primary power supply and the second voltage domain is supplied from a secondary power supply.

15. The power supply apparatus of claim 14, wherein the primary power supply comprises a battery.

16. The power supply apparatus of claim 9, wherein the level shifter module comprises a flip-flop in the first voltage domain, the flip-flop having a first input connected to receive a first control signal from the control module, and
wherein the control module includes duplicate elements receiving the first control signal for providing to a second input of the flip-flop a second control signal, inverted relative to the first control signal.

* * * * *